United States Patent
Tani et al.

(10) Patent No.: US 6,784,523 B2
(45) Date of Patent: Aug. 31, 2004

(54) METHOD OF FABRICATING SEMICONDUCTOR DEVICE

(75) Inventors: Takayuki Tani, Gunma (JP); Haruo Hyoudo, Gunma (JP); Takao Shibuya, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 270 days.

(21) Appl. No.: 09/974,847

(22) Filed: Oct. 12, 2001

(65) Prior Publication Data

US 2002/0022312 A1 Feb. 21, 2002

Related U.S. Application Data

(62) Division of application No. 09/441,885, filed on Nov. 17, 1999, now Pat. No. 6,326,232.

(30) Foreign Application Priority Data

Nov. 18, 1998 (JP) .......................................... 10-328320

(51) Int. Cl.[7] .............................................. H01L 23/495
(52) U.S. Cl. ....................................... 257/666; 257/734
(58) Field of Search ................................. 257/666, 678, 257/676, 672, 693, 734, 735, 777, 778

(56) References Cited

U.S. PATENT DOCUMENTS

| | | | |
|---|---|---|---|
| 5,198,964 A | | 3/1993 | Ito et al. |
| 5,402,255 A | | 3/1995 | Nakanishi et al. |
| 5,832,600 A | * | 11/1998 | Hashimoto .................... 29/841 |
| 5,849,606 A | | 12/1998 | Kikuchi et al. |
| 6,054,338 A | | 4/2000 | Lee et al. |
| 6,197,616 B1 | * | 3/2001 | Hyoudo et al. ............. 438/113 |
| 6,309,911 B2 | * | 10/2001 | Hyoudo et al. ............. 438/113 |
| 6,326,232 B1 | * | 12/2001 | Tani et al. .................... 438/106 |

FOREIGN PATENT DOCUMENTS

| | | |
|---|---|---|
| EP | 0 751 561 | 1/1997 |
| EP | 0 883 171 | 12/1998 |
| EP | 0 923 120 | 6/1999 |
| EP | 0 932 198 | 7/1999 |
| JP | 09036151 | 2/1997 |
| JP | 10135252 | 5/1998 |
| JP | 10150119 | 6/1998 |
| JP | 10308473 | 11/1998 |
| WO | 98/44547 | 11/1998 |

* cited by examiner

Primary Examiner—David Nelms
Assistant Examiner—David Nhu
(74) Attorney, Agent, or Firm—Wenderoth, Lind & Ponack L.L.P.

(57) ABSTRACT

An object of the present invention is to provide a method of fabricating a semiconductor device having a relatively small package structure and hence a relatively small mounting area. Another object of the present invention is to provide a method of fabricating a semiconductor device relatively inexpensively. An insulating board with a plurality of device carrier areas thereon is prepared, and islands and leads are formed on the device carrier areas electrically connected via through holes to external electrodes on the back of the insulating board. The external electrodes are spaced or retracted inwardly from edges of the device carrier areas. Semiconductor chips are mounted on the respective device carrier areas by die bonding and wire bonding, and then covered with a common resin layer. The resin layer and the insulating board are separated along cutting lines into segments including the device carrier areas thereby to produce individual semiconductor devices.

20 Claims, 6 Drawing Sheets

METHOD OF FABRICATING SEMICONDUCTOR DEVICE

This application is a divisional of U.S. application Ser. No. 09/441,885, filed Nov. 17, 1999 now U.S. Pat. No. 6,326,232 issued Dec. 4, 2001.

BACKGROUND OF THE INVENTION

1. Field of the Invention

The present invention relates to a method of fabricating a semiconductor device, and more particularly to a method of fabricating a semiconductor device having a reduced package contour, a reduced mounting area, and a reduced cost.

2. Description of the Related Art

In the fabrication of semiconductor devices, it has been customary to separate semiconductor chips from a wafer by cutting, fixing the semiconductor chips to a lead frame, sealing the semiconductor chips fixed to the lead frame with a mold and a synthetic resin according to a transfer molding process, and dividing the sealed semiconductor chips into individual semiconductor devices. The lead frame comprises a rectangular or hooped frame. A plurality of semiconductor devices are simultaneously sealed in one sealing process.

FIG. 1 of the accompanying drawings illustrates a conventional transfer molding process. In the conventional transfer molding process, a lead frame 2 to which semiconductor chips 1 are fixed by die bonding and wire bonding is placed in a cavity 4 defined by upper and lower molds 3A, 3B. Epoxy resin is then poured into the cavity 4 to seal the semiconductor chips 1. After the transfer molding process, the lead frame 2 is cut off into segments containing the respective semiconductor chips 1, thus producing individual semiconductor devices. For more details, reference should be made to Japanese laid-open patent publication No. 05-129473, for example.

Actually, as shown in FIG. 2 of the accompanying drawings, the lower mold 3B has a number of cavities 4a–4f, a source 5 of synthetic resin, a runner 6 connected to the source 5 of synthetic resin, and gates 7 for pouring the synthetic resin from the runner 6 into the cavities 4a–4f. The cavities 4a–4f, the source 5 of synthetic resin, the runner 6, and the gates 7 are all in the form of recesses and grooves defined in the surface of the lower mold 3B. If the lead frame 2 is of a rectangular shape, then ten semiconductor chips 1 are mounted on one lead frame, and the lower mold 3B has ten cavities 4, ten gates 7, and one runner 6 per lead frame. The entire lower mold 3B has as many cavities 4 as necessary for twenty lead frames 2, for example.

FIG. 3 of the accompanying drawings shows a semiconductor device fabricated by the conventional transfer molding process. As shown in FIG. 3, a semiconductor chip 1 containing components such as transistors is fixedly mounted on an island 8 of a lead frame by a bonding material 9 such as solder. The semiconductor chip 1 has electrode pads connected to leads 10 by wires 11, and has its peripheral portions covered with a molded body 12 of synthetic resin which is complementary in shape to the cavity 4. The leads 10 have respective distal ends projecting out of the molded body 12 of synthetic resin.

In the conventional semiconductor package shown in FIG. 3, since the leads 10 for connection to external circuits projects from the molded body 12 of synthetic resin, dimensions of the package that extends up to the projecting distal ends of the leads 10 need to be considered as covering a mounting area of the package. Therefore, the mounting area of the package is much larger than the contour of the molded body 12 of synthetic resin.

Furthermore, according to the conventional transfer molding process, since the molded body 12 of synthetic resin is hardened while it is being placed under pressure, the synthetic resin is also hardened in the runner 6 and the gates 7, and the hardened synthetic resin in the runner 6 and the gates 7 has to be thrown away. Because the gates 7 are required for respective individual semiconductor devices to be fabricated, the synthetic resin is not utilized highly efficiently, and the number of semiconductor devices that can be fabricated is small relative to the amount of synthetic resin used.

SUMMARY OF THE INVENTION

It is therefore an object of the present invention to provide a method of fabricating a semiconductor device having a relatively small package structure and hence a relatively small mounting area.

Another object of the present invention is to provide a method of fabricating a semiconductor device relatively inexpensively.

According to the present invention, there is provided a method of fabricating a semiconductor device, comprising the steps of preparing an insulating board with a plurality of device carrier areas thereon, fixing semiconductor chips respectively to the device carrier areas, placing an electrode pattern serving as external electrodes of the semiconductor chips on a back of the insulating board, covering the semiconductor chips with a resin layer, and separating the resin layer and the insulating board into segments including the device carrier areas thereby to produce individual semiconductor devices, the electrode pattern being spaced inwardly from edges of the segments.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

A method of fabricating a semiconductor device according to the present invention will be described below in terms of successive steps thereof with reference to FIGS. 4 through 8A–8C.

Figure 1:
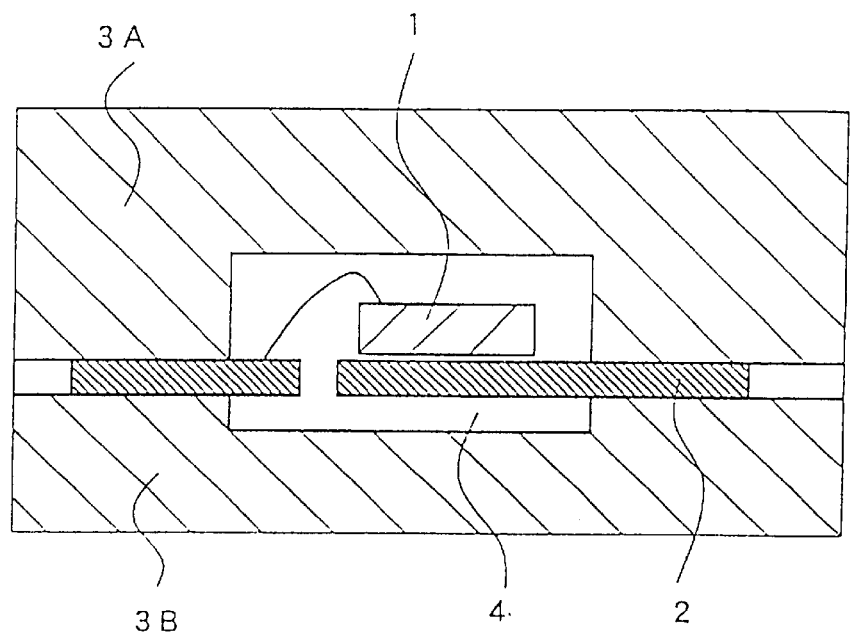
FIG. 1 is a cross-sectional view illustrative of a conventional transfer molding process.
Figure 2:
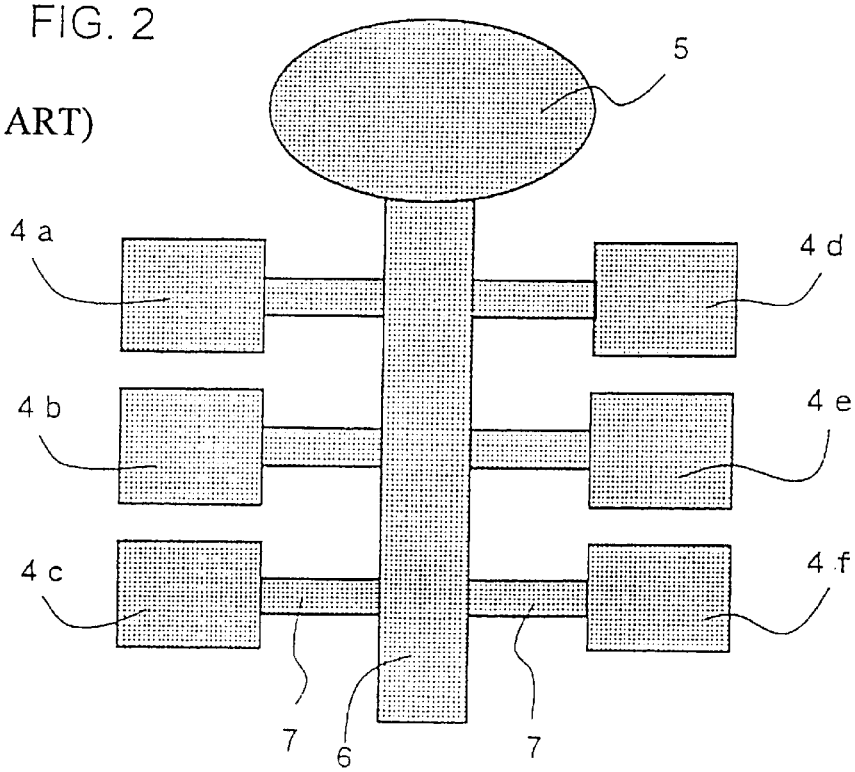
FIG. 2 is a plan view illustrative of the conventional transfer molding process.
Figure 3:
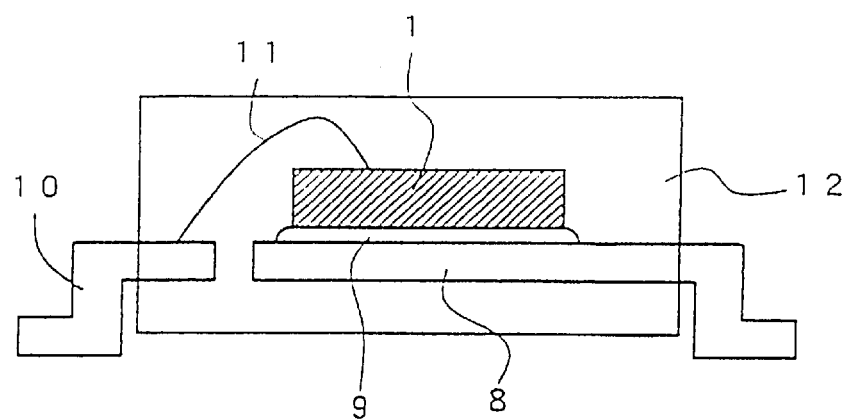
FIG. 3 is a cross-sectional view of a semiconductor device fabricated by the conventional transfer molding process.
Figure 4:
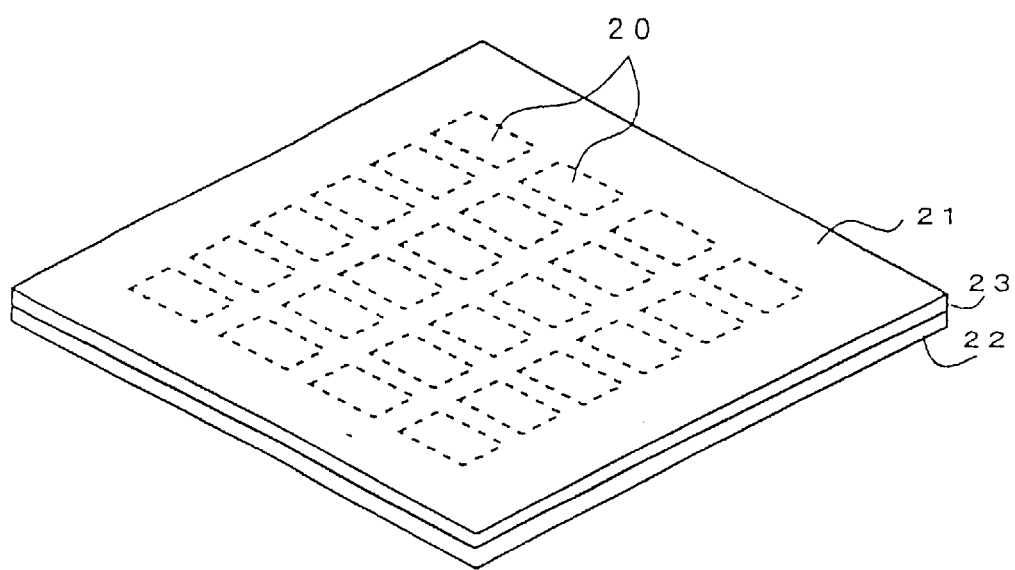
FIG. 4 is a perspective view illustrative of a method of fabricating a semiconductor device according to the present invention.

1ST STEP:

First, as shown in FIG. 4, a large-size common board 21 having a two-dimensional matrix of one hundred device carrier areas 20 is provided, with each area corresponding to a semiconductor device. The common board 21 comprises one or more insulating boards of ceramics, glass epoxy, or the like, and has a total thickness ranging from 250 to 350 $\mu$m to provide a mechanical strength large enough to withstand stresses imposed during the fabrication process. In the illustrated embodiment, the common board 21 comprises a first insulating board 22 having a thickness of about 100 $\mu$m and a second insulating board 23 having a thickness of about 200 $\mu$m. The first and second insulating boards 22, 23 are superposed one on the other.

An electrically conductive pattern made of printed metal paste of tungsten or the like and electroplated gold is formed on the surface of each of the device carrier areas 20. Specifically, the first and second insulating boards 22, 23 each with printed metal paste of tungsten or the like are bonded to each other and then baked, after which a plated layer of gold is formed on the printed metal paste by an electroplating process.

Figure 5A:
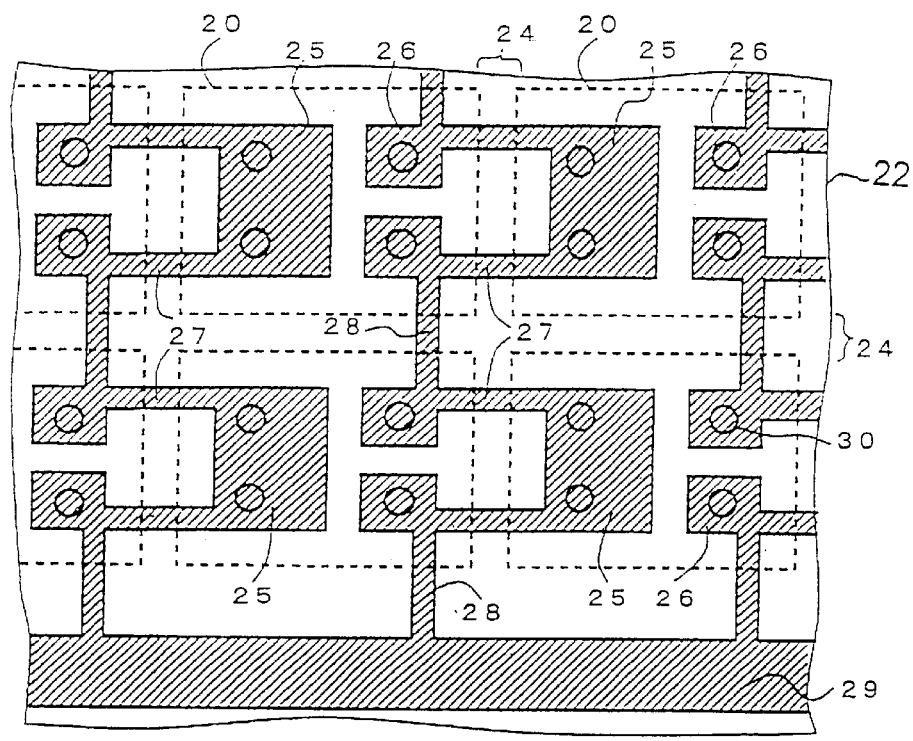
FIGS. 5A and 5B are fragmentary plan views illustrative of the method of fabricating a semiconductor device according to the present invention.
Figure 5B:
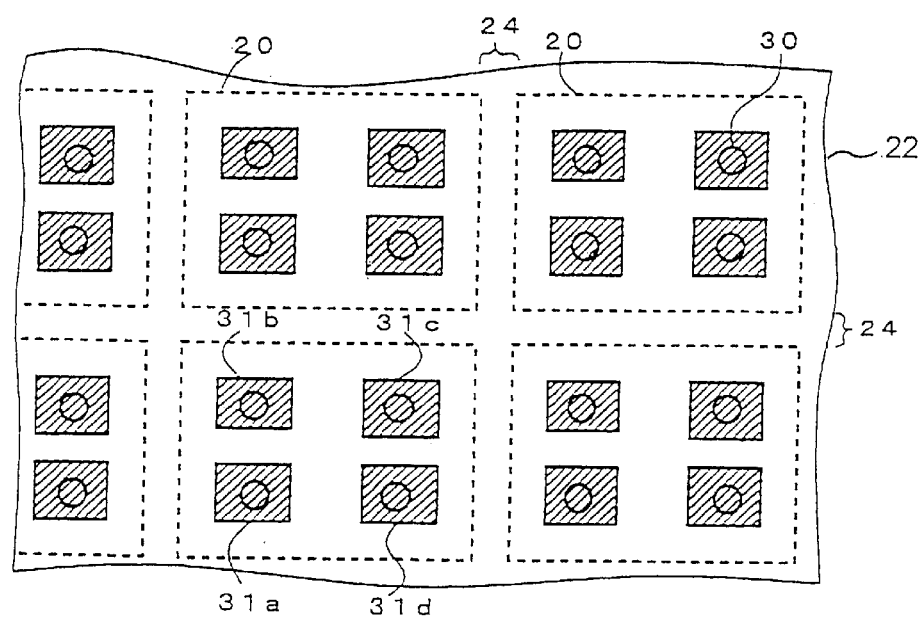

FIG. 5A shows in plan an electrically conductive pattern formed on the face of the first insulating board 22, and FIG. 5B shows in plan an electrically conductive pattern formed on the back of the first insulating board 22.

Each of the device carrier areas 20, enclosed by the dotted lines, has a rectangular shape having a longer side which is 1.0 mm long and a shorter side which is 0.8 mm long. The device carrier areas 20 are arranged in a two-dimensional matrix, and adjacent ones of the device carrier areas 20 are spaced from each other by a distance ranging from 20 to 50 $\mu$m. The spacing between adjacent ones of the device carrier areas 20 serves as a cutting line 24 in a subsequent step. In each of the carrier areas 20, the electrically conductive pattern provides an island 25 and leads 26. The electrically conductive pattern segments in the device carrier areas 20 are identical in shape to each other.

The island 25 is a region where a semiconductor chip is to be mounted, and the leads 26 are to be connected by wires to electrode pads of a semiconductor chip on the island 25. Two first joint arms 27, each having a width of 0.5 mm, for example, much smaller than the width of the island 25, extend continuously from the island 25 across the cutting line 24 to the leads 26 of an adjacent device carrier area 20. Two second joint arms 28 extend continuously from the leads 26 in directions perpendicular to the first joint arms 27 across the cutting lines 24 to the leads 26 of adjacent device carrier areas 20. Some of the second joint arms 28 are connected to a common joint 29 extending around the device carrier areas 20. The first and second joint arms 27, 28 which are thus extended and connected electrically connect the islands 25 and the leads 26 to each other.

As shown in FIG. 5B, the first insulating board 22 has through holes 30 defined in each of the device carrier areas 20. An electrically conductive material such as tungsten is filled in the through holes 30. External electrodes 31a, 31b, 31c, 31d are formed on the back of the first insulating board 22 in alignment with the respective through holes 30. The external electrodes 31a, 31b, 31c, 31d are spaced or retracted a distance ranging from 0.05 to 0.1 mm inwardly from the edges of each of the device carrier areas 20, and electrically connected to the common joint 29 via the through holes 30.

Figure 6A:
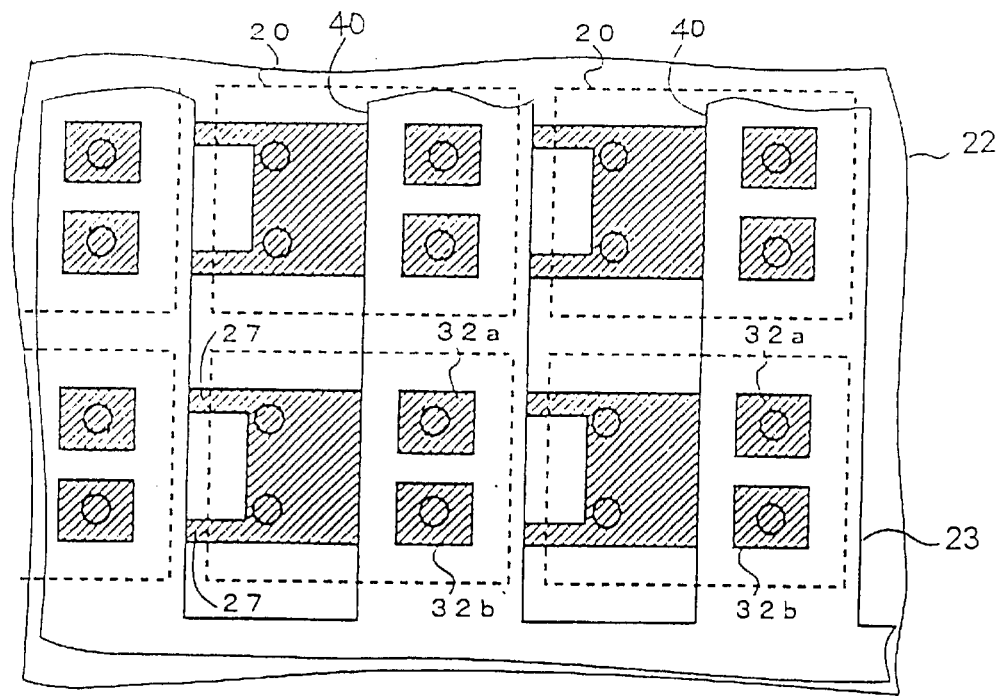
FIGS. 6A and 6B are plan and cross-sectional views, respectively, illustrative of the method of fabricating a semiconductor device according to the present invention.
Figure 6B:
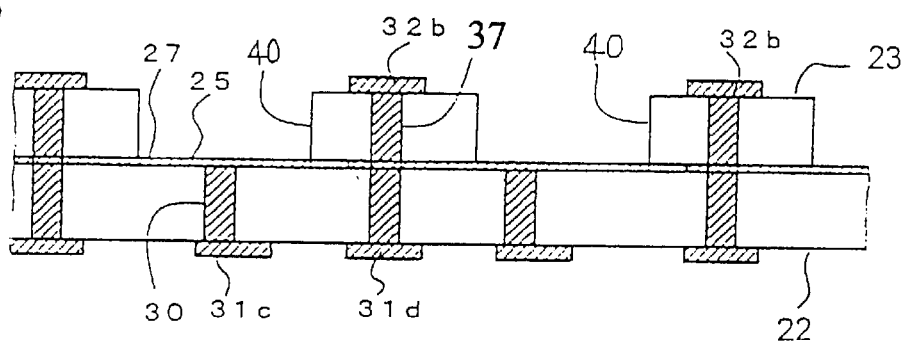
Figure 7A:
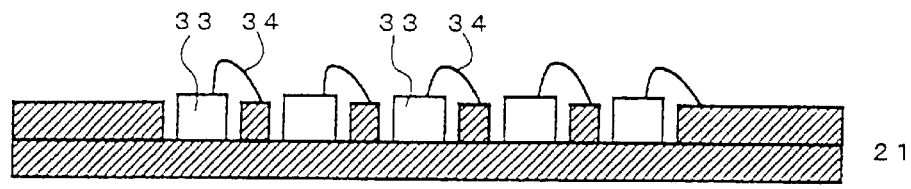
FIGS. 7A through 7D are cross-sectional views illustrative of the method of fabricating a semiconductor device according to the present invention.
Figure 7B:
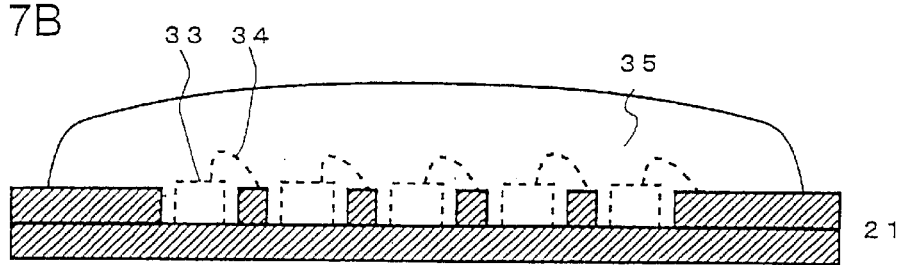
Figure 7C:
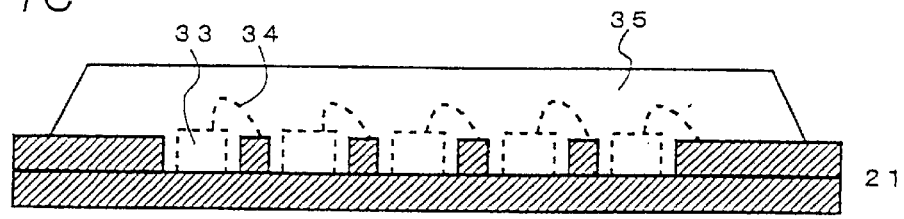
Figure 7D:
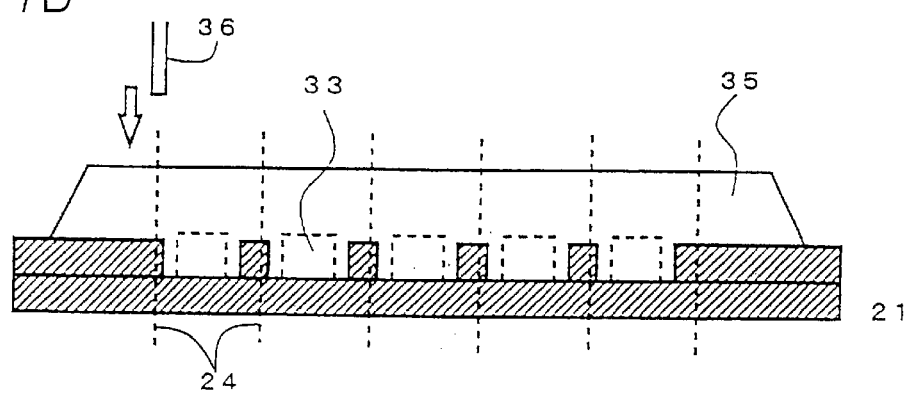

FIG. 6A shows in plan the second insulating board 23 bonded to the first insulating board 22, and FIG. 6B shows in cross section the second insulating board 23 bonded to the first insulating board 22.

The second insulating board 23 has openings 40 extending over the islands 25 and leads 32a, 32b vertically aligned with the leads 26. The second insulating board 23 has through holes 37 defined therein in alignment with the leads 32a, 32b and are electronically connected to the respective leads 26 on the first insulating board 22. Therefore, the leads 26 are electrically connected to the external electrodes 31c, 31d.

The leads 32a, 32b are spaced or retracted a distance ranging from about 0.05 to 0.1 mm inwardly from the edges of each of the device carrier areas 20. Only the first and second joint arms 27, 28 of the narrow width extend across the dicing lines 24.

With the first and second insulating boards 22, 23 bonded to each other, a plated layer of gold of the electrically conductive pattern is formed by the electroplating process which employs the electrically conductive pattern as one electrode. Since the electrically conductive pattern segments in the device carrier areas 20 are electrically connected to each other by the common joint 29, it is possible to employ the electroplating process. However, no plated layer is formed on the mating surfaces of the first and second insulating boards 22, 23.

2ND STEP: (FIG. 7A)

Semiconductor chips 33 are mounted on the respective device carrier areas 20 of the common board 21 with the plated layer of gold, by die bonding and wire bonding. Specifically, the semiconductor chips 33 are fixed to the surfaces of the islands 25 by an adhesive such as an Ag paste, and the electrode pads of the semiconductor chips 33 are connected to the leads 32a, 32b by wires 34. The semiconductor chips 33 comprise three-terminal active components such as bipolar transistors, power MOSFETs, or the like. If the semiconductor chips 33 comprise power MOSFETs, then the external electrodes 31a, 31b serve as drain electrodes, and the external electrodes 31c, 31d serve as source and drain electrodes, respectively.

3RD STEP: (FIG. 7B)

A predetermined amount of liquid epoxy resin is dropped from a dispenser delivered to a position over the common board 21 by potting to cover all the semiconductor chips 33 with a common resin layer 35. For example, if one hundred semiconductor chips 33 are mounted on one common board 21, then all of the one hundred semiconductor chips 33 are covered with the common resin layer 35. The liquid epoxy resin may be CV576AN (manufactured by Matsushita Electric Works, Ltd.). Since the dropped liquid epoxy resin is relatively highly viscous and has a surface tension, the common resin layer 35 has a round surface.

4TH STEP: (FIG. 7C)

The round surface of the common resin layer 35 is processed into a flat surface. For example, a flat member may be pressed against the round surface of the common resin layer 35 to flatten the surface before the dropped liquid resin is hardened, or after the dropped liquid resin is cured at a temperature ranging from 100 to 200 degrees for several hours, the round surface of the common resin layer 35 may be cut to a flat surface by a cutting device with a cutting blade. Specifically, the round surface of the common resin layer 35 may be scraped off by the cutting blade to achieve a constant height from the common board 21. In this step, the thickness of the common resin layer 35 is set to 0.3–1.0 mm. The flat surface extends to the edges of the common resin layer 35 such that when outermost semiconductor chips 33 are separated into individual semiconductor devices, they have resin layer contours which meet a standardized package size requirement. Of various available cutting blades having different thicknesses, a relatively thick cutting blade is used to scrape the round surface of the common resin layer 35 repeatedly a plurality of times to develop a flat surface.

The common resin layer 35 is severed into segments containing the respective device carrier areas 20 to separate individual semiconductor devices by a cutting device. Specifically, a cutting blade 36 is used to cut off the common resin layer 35 and the common board 21 simultaneously along the cutting lines 24 to produce separate semiconductor devices on the respective device carrier areas 20. In the cutting process, a blue sheet (e.g., trade name: UV SHEET manufactured by Lintec Corp.) is applied to the back of the common board 21, and the cutting blade 36 is thrust to such a depth as to reach the surface of the blue sheet thereby to cut off the common resin layer 35 and the common board 21. At this time, the cutting device automatically recognizes alignment marks on the surface of the common board 21 and uses the alignment marks as a positional reference in the cutting process.

Figure 8A:
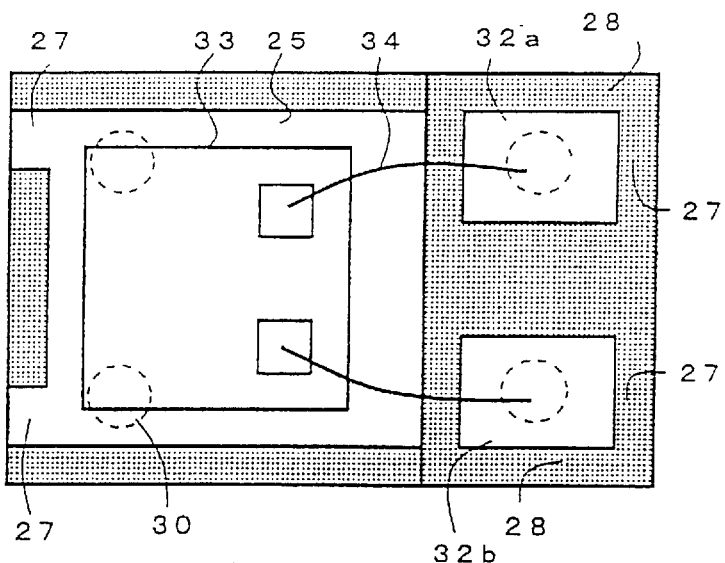
FIGS. 8A through 8C are planesees, cross-sectional, and backside views, respectively, illustrative of the method of fabricating a semiconductor device according to the present invention.
Figure 8B:
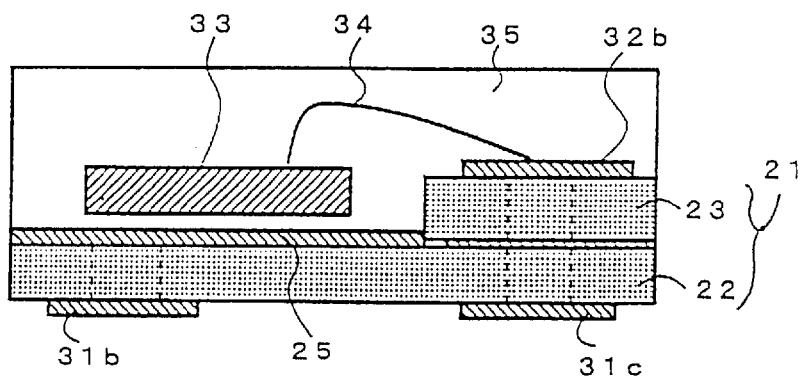
Figure 8C:
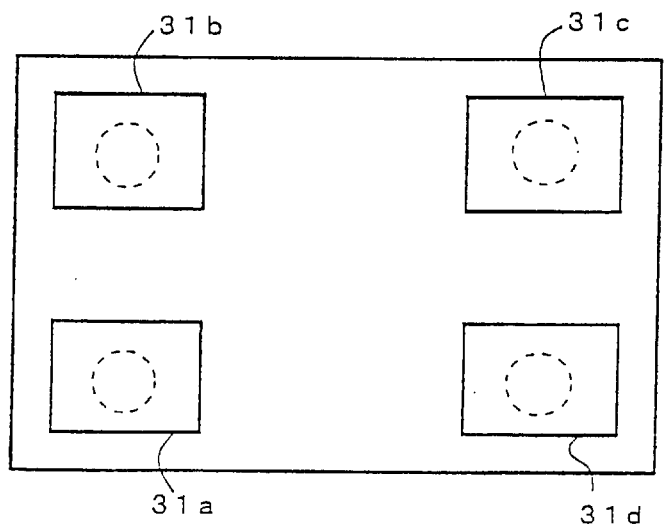

FIGS. 8A through 8C show a semiconductor device 33 fabricated by the above successive steps.

Each package of the semiconductor device 33 has four sides defined by cut edges of the resin layer 35 and the common board 21, an upper surface defined by the flat surface of the resin layer 35, and a lower surface defined by the back of the first insulating board 22. The second insulating board 23 gives a height difference between the leads 32a, 32b and the island 25. The second insulating board 23 remains along one side where the leads 32a, 32b are present.

The island 25 and the leads 32a, 32b are spaced or retracted from the edges of the package, with cut edges of the first and second joint arms 27, 28 being exposed on edges of the package. Similarly, the external electrodes 31a through 31d of plated gold on the back of the first insulating board 22 are also spaced or retracted from the edges of the package.

The semiconductor device thus fabricated offers the following advantages:

Since a number of devices are packaged together by a resin layer, any waste amount of resin material used is smaller than if the devices were individually packaged, and the cost of resin material used is also lower.

Because no lead frames are used, the package contour is much smaller than if the devices were fabricated by the conventional transfer molding process.

Inasmuch as the terminals for external connection are formed on the back of the common board 21 and do not project out of the package contour, the mounting area of the device is highly reduced.

The external electrodes 31a through 31d are independent as islands and have their ends spaced or retracted from the package edges. Therefore, when the device is cut off by cutting, the cutting blade is kept out of contact with the plated layer of gold of the external electrodes 31a through 31d. If the plated layer of gold were cut off by the cutting blade, the plated layer of gold would not fully be severed but would tend to leave whiskers, resulting in a poor appearance. According to the present invention, however, a since the cutting blade is kept out of contact with the plated layer of gold, no such poor appearance results from the cutting process.

The external electrodes 31a through 31d are electrically connected in common by the first and second joint arms 27, 28 via the through holes 30. Therefore, the electroplating process can be used with the commonly connected external electrodes 31a through 31d serving as one electrode.

Because only the plated layer of gold which is subject to cutting is the first and second joint arms 27, 28, any plated layer of gold that is brought into contact with the cutting blade is held to a minimum.

The method according to the present invention can produce a package structure which is smaller than semiconductor devices using a lead frame. Since no lead terminals project from the package, the package has a reduced mounting area and can be mounted at a high density.

The cost of the fabrication process is highly reduced because no molds with cavities are required for sealing semiconductor chips.

Inasmuch as the external electrodes on the back of the common board are patterned so as to be held out of contact with the cutting blade, the semiconductor device does not suffer an appearance problem which would otherwise result from cutting off the plated layer of gold with the cutting blade.

Although a certain preferred embodiment of the present invention has been shown and described in detail, it should be understood that various changes and modifications may be made therein without departing from the scope of the appended claims.

What is claimed is:

1. An insulating board for use in fabricating a semiconductor device, comprising:
   a board that defines device carrier areas, with each of said device carrier areas having at least one external electrode on a back surface of said board, at least one island and at least one lead on a front surface of said board, and at least one through hole connecting said at least one electrode to said at least one island or said at least one lead;
   a common joint extending around said device carrier areas; and
   joint arms electrically interconnecting adjacent ones of said device carrier areas and electrically interconnecting said device carrier areas and said common joint, said joint arms being on said front surface of said board.

2. The insulating board according to claim 1, wherein each said at least one through hole is filled with a conductive material such that each said at least one external electrode is electrically connected to said common joint via said filled through holes and said joint arms.

3. The insulating board according to claim 2, wherein each of said joint arms is narrower than each said at least one island.

4. The insulating board according to claim 2, wherein said joint arms that electrically interconnect adjacent ones of said device carrier areas comprise first joint arms that interconnect said at least one island of a first of said adjacent ones of said device carrier areas to said at least one lead of a second of said adjacent ones of said device carrier areas.

5. The insulating board according to claim 4, wherein said joint arms that electrically interconnect adjacent ones of said device carrier areas also comprise second joint arms that interconnect said at least one lead of said first of said adjacent ones of said device carrier areas to said at least one lead of a third of said adjacent ones of said device carrier areas.

6. The insulating board according to claim 5, wherein said first joint arms extend perpendicularly to said second joint arms.

7. The insulating board according to claim 6, wherein said joint arms that electrically interconnect said device carrier areas and said common joint comprise third joint arms that interconnect said at least one lead of each of said device carrier areas to said common joint.

8. The insulating board according to claim 7, wherein said third joint arms extend perpendicularly to said first joint arms.

9. The insulating board according to claim 8, wherein each of said first, second and third joint arms is narrower than each of said at least one island.

10. The insulating board according to claim 5, wherein said joint arms that electrically interconnect said device carrier areas and said common joint comprise third joint arms that interconnect said at least one lead of each of said device carrier areas to said common joint.

11. The insulating board according to claim 10, wherein said third joint arms extend perpendicularly to said first joint arms.

12. The insulating board according to claim 1, wherein each of said first, second and third joint arms is narrower than each said at least one island.

13. The insulating board according to claim 1, wherein said joint arms that electrically interconnect adjacent ones of said device carrier areas comprise first joint arms that interconnect said at least one island of a first of said adjacent ones of said device carrier areas to said at least one lead of a second of said adjacent ones of said device carrier areas.

14. The insulating board according to claim 13, wherein said joint arms that electrically interconnect adjacent ones of said device carrier areas also comprise second joint arms that interconnect said at least one lead of said first of said adjacent ones of said device carrier areas to said at least one lead of a third of said adjacent ones of said device carrier areas.

15. The insulating board according to claim 14, wherein said first joint arms extend perpendicularly to said second joint arms.

16. The insulating board according to claim 15, wherein said joint arms that electrically interconnect said device carrier areas and said common joint comprise third joint arms that interconnect said at least one lead of each of said device carrier areas to said common joint.

17. The insulating board according to claim 16, wherein said third joint arms extend perpendicularly to said first joint arms.

18. The insulating board according to claim 17, wherein each of said first, second and third joint arms is narrower than each said at least one island.

19. The insulating board according to claim 14, wherein said joint arms that electrically interconnect said device carrier areas and said common joint comprise third joint arms that interconnect said at least one lead of each of said device carrier areas to said common joint.

20. The insulating board according to claim 19, wherein said third joint arms extend perpendicularly to said first joint arms.

* * * * *